(12) United States Patent
Kasha et al.

(10) Patent No.: US 8,346,198 B2
(45) Date of Patent: *Jan. 1, 2013

(54) LOW NOISE AMPLIFIER FOR A RADIO RECEIVER

(75) Inventors: Dan B. Kasha, Seattle, WA (US); G. Tyson Tuttle, Austin, TX (US); Gregory A. Hodgson, Pflugerville, TX (US)

(73) Assignee: Silicon Laboratories Inc., Austin, TX (US)

( * ) Notice: Subject to any disclaimer, the term of this patent is extended or adjusted under 35 U.S.C. 154(b) by 1935 days.

This patent is subject to a terminal disclaimer.

(21) Appl. No.: 11/171,817

(22) Filed: Jun. 30, 2005

(65) Prior Publication Data

US 2007/0052482 A1 Mar. 8, 2007

(51) Int. Cl.
*H04B 1/18* (2006.01)

(52) U.S. Cl. ........ 455/280; 455/284; 455/290; 330/286; 330/307

(58) Field of Classification Search ................. 455/280, 455/281, 283, 284, 289, 290, 291, 292, 269, 455/234.1; 330/278, 285, 296, 307, 286

See application file for complete search history.

(56) References Cited

U.S. PATENT DOCUMENTS

| | | | |
|---|---|---|---|
| 4,107,621 A | 8/1978 | Furutani et al. | |
| 5,270,667 A | 12/1993 | Upton | 320/270 |
| 6,075,414 A | 6/2000 | Nagaoka et al. | 330/284 |
| 6,100,759 A | 8/2000 | Sirna et al. | |
| 6,147,568 A | 11/2000 | Souetinov | 333/81 |
| 6,181,206 B1 * | 1/2001 | Palmisano et al. | 330/278 |
| 6,356,745 B1 * | 3/2002 | Lee et al. | 455/232.1 |
| 6,400,204 B1 | 6/2002 | Davis | |
| 6,553,216 B1 | 4/2003 | Pugel et al. | |
| 6,683,511 B2 | 1/2004 | Souetinov et al. | 333/81 |
| 6,724,827 B1 | 4/2004 | Patsiokas et al. | 375/259 |
| 6,735,418 B1 * | 5/2004 | MacNally et al. | 455/78 |
| 6,771,475 B2 * | 8/2004 | Leete | 361/56 |
| 7,202,749 B2 | 4/2007 | Mohammadi | 330/307 |
| 7,209,727 B2 * | 4/2007 | Castaneda et al. | 455/341 |
| 7,355,476 B2 * | 4/2008 | Kasha et al. | 330/284 |
| 7,512,386 B2 * | 3/2009 | Kalajo et al. | 455/127.1 |
| 7,660,566 B2 | 2/2010 | Kuo et al. | |
| 2003/0001690 A1 * | 1/2003 | Kuroda et al. | 333/134 |
| 2003/0117206 A1 | 6/2003 | Ohnakado | |
| 2005/0134385 A1 * | 6/2005 | Costa et al. | 330/283 |
| 2007/0058308 A1 | 3/2007 | Thijs et al. | |

OTHER PUBLICATIONS

U.S. Patent and Trademark Office Official Action dated Feb. 2, 2007 for Related U.S. Appl. No. 11/171,042, pp. 1-9.
Reply to Official Action dated Feb. 2, 2007, Filed on Apr. 20, 2007, pp. 1-9.
U.S. Patent and Trademark Office Official Action dated Jul. 3, 2007 for Related U.S. Appl. No. 11/171,042, pp. 1-9.

(Continued)

*Primary Examiner* — Christian Hannon
(74) *Attorney, Agent, or Firm* — Trop, Pruner & Hu, P.C.

(57) ABSTRACT

In one embodiment, the present invention includes an amplifier having a transistor stage coupled between a supply voltage and a bias current. The transistor stage has an input to receive a radio frequency (RF) input signal obtained from an antenna. The amplifier has an input impedance that is unmatched to a source impedance of the antenna. In some embodiments, this unmatched input impedance may be substantially greater than the source impedance, and may further be controlled based on a strength of the RF input signal.

26 Claims, 9 Drawing Sheets

OTHER PUBLICATIONS

Reply to Official Action dated Jul. 3, 2007, Filed on Oct. 2, 2007, pp. 1-10.

U.S. Appl. No. 11/001,282, filed Dec. 1, 2004, entitled "Controlling the Gain of a Remote Active Antenna" by Charles D. Thompson.

U.S. Appl. No. 11/172,475, filed Jun. 30, 2005, entitled "Receiver Having Digital Automatic Gain Control" by Vishnu Srinivasan, G. Tyson Tuttle, Dan Kasha and Alessandro Piovaccari.

U.S. Appl. No. 10/881,926, filed Jun. 30, 2004, entitled "Integrated Low-IF Terrestrial Audio Broadcast Receiver and Associated Method" by G. Tyson Tuttle and Dan Kasha.

U.S. Appl. No. 11/081,959, filed Mar. 16, 2005, entitled "On-Chip Calibration Signal Generation for Tunable Filters for RF Communications and Associated Methods" by G. Tyson Tuttle and Dan Kasha.

U.S. Appl. No. 11/171,042, filed Jun. 30, 2005, entitled "An Input Stage for an Amplifier" by Dan B. Kasha, G. Tyson Tuttle and Gregory A. Hodgson.

U.S. Patent and Trademark Office, Office Action Mailed Oct. 14, 2008 with Reply to Office Action filed on Jan. 13, 2009, in U.S. Appl. No. 12/069,604.

U.S. Patent and Trademark Office, Final Office Action Mailed Apr. 21, 2009 with Reply to Final Office Action filed on Jun. 9, 2009, in U.S. Appl. No. 12/069,604.

U.S. Patent and Trademark Office, Notice of Allowance and Fee(s) Due Mailed Sep. 24, 2009, in U.S. Appl. No. 12/069,604.

*Silicon Laboratories Inc.* (Plaintiff), vs. *Quintic Corporation* and *Quintic Microelectronics Co., Ltd.* (Defendants), Civil Action No. A10CA066 SS, Complaint for Patent Infringement filed on Jan. 25, 2010, in the United State District Court Western District of Texas Austin Division.

U.S. Appl. No. 12/692,730, filed Jan. 25, 2010, entitled "An Input Stage for an Amplifier," by Dan B. Kasha, et al.

U.S. Patent and Trademark Office, Final Office Action mailed Mar. 3, 2011 in U.S. Appl. No. 12/692,730.

U.S. Patent and Trademark Office, Office Action mailed Oct. 7, 2011 with Reply filed Jan. 5, 2012 in U.S. Appl. No. 12/692,730.

United States District Court for the Western District of Texas, Austin Division, *Silicon Laboratories Inc.*, Plaintiff vs. *Quintic Corporation* and *Quintic Microelectronics Co., Ltd.*, Defendants, Order of Dismissal signed Aug. 26, 2010.

U.S. Patent and Trademark Office, Office Action mailed Oct. 21, 2010 in U.S. Appl. No. 12/692,730.

Reply to Office Action mailed Oct. 21, 2010 filed on Jan. 20, 2011 in U.S. Appl. No. 12/692,730.

\* cited by examiner

LOW NOISE AMPLIFIER FOR A RADIO RECEIVER

FIELD OF THE INVENTION

The invention generally relates to a receiver that has a controllable amplifier.

BACKGROUND

A conventional radio frequency (RF) receiver includes various gain stages for purposes of receiving a relatively small magnitude RF signal and translating the received RF signal to an intermediate frequency (IF) signal.

The RF signal that is received by the receiver typically is provided from an antenna source and varies in strength. An input stage of the receiver typically includes an amplifier such as a low noise amplifier (LNA) to amplify the incoming signal, preferably without introducing distortion. The LNA is typically designed to match the impedance of the source (e.g., antenna). In many instances, the LNA is designed to have a fixed impedance, typically 50 or 75 ohms ($\Omega$).

Conventional amplifiers for a receiver are formed using bipolar complementary metal oxide semiconductor (BiC-MOS) technology. For example, a common base amplifier formed of a bipolar transistor is often used. Such an amplifier has a transconductance, gm, that equals the bias current divided by 0.26 volts. Because the impedance seen by the source is approximately equal to 1/gm, the bias current is chosen to achieve the desired termination (i.e., matching) impedance. Furthermore, the gain of the amplifier is also linked to the transconductance and is equal to the transconductance multiplied by the load resistance. Accordingly, the power dissipation of a conventional LNA is determined when the input impedance is chosen. However, by using a matched impedance, power dissipation may be greater than desired.

In addition to power dissipation issues, a matched impedance LNA presents other problems, particularly in portable applications. Namely, it is difficult to control antenna impedance and therefore the source and amplifier may not have properly matched impedances, causing reflections. Furthermore, a single amplifier design cannot be flexibly used in multiple designs, as it cannot be accommodated to sources having different impedances.

To overcome at least the power dissipation issues, some designs use a resonant inductor-capacitor (LC) impedance transformation network. In such a design, the LNA input impedance may be set at a higher value, consuming less current in the amplifier, while still providing a matching impedance to the antenna. However, significant downsides to this approach exist. First, the transformation network requires large components which consume board real estate and add cost. Another concern is that the transformation network increases signal magnitude at the amplifier, which has a negative effect on intermodulation performance of the amplifier.

A need thus exists for improved amplifier designs for a receiver.

SUMMARY OF THE INVENTION

In one embodiment, the present invention includes an amplifier having a transistor stage coupled between a supply voltage and a bias current. The transistor stage has an input to receive a radio frequency (RF) input signal obtained from an antenna via an RF input node. The amplifier, which may be a low noise amplifier (LNA) has an input impedance that is unmatched to a source impedance of the antenna. In some embodiments, this unmatched input impedance may be substantially greater than the source impedance, and may further be controlled based on a strength of the RF input signal. The LNA may be implemented in an integrated circuit (IC) and in some embodiments, the IC may further include a controller to adjust the bias current.

Other embodiments may include an amplifier that is integrated with a processor coupled to the amplifier to digitally control its operation. Different parameters and characteristics of both the amplifier, its input and output stages may be controlled by the processor, which may be a microcontroller in some embodiments. For example, an integrated bias generator may be controlled to provide an adjustable bias current to the amplifier.

Other embodiments are realized in a method for controlling an amplifier. In one such embodiment the method may include determining a signal strength of a RF signal received at an amplifier of a receiver, and controlling at least one component of the amplifier during operation of the receiver to attain a desired power level based on the signal strength. Different manners of controlling amplifier components may be implemented. For example, a device size of a transistor stage of the amplifier may be modified, components of an input stage may be adjusted, along with output components such as a filter capacitor.

Applications for an amplifier in accordance with an embodiment of the present invention are numerous. As one example, an integrated terrestrial audio broadcast receiver may implement the amplifier, which may be formed as an integrated circuit using a complementary metal oxide semiconductor (CMOS) or similar process. The receiver may include, in addition to the amplifier and an integrated controller for it, a mixer to receive the amplified RF signal and to provide an intermediate frequency (IF) signal, an analog-to-digital converter to convert the IF signal into a digital signal, and a digital signal processor to process the digital signal. The receiver may be used in a portable device having an integrated terrestrial audio broadcast receiver. The portable device, which may be a digital media player, such as an MP3 player, can include the ability to receive a wide variety of audio broadcasts, including AM spectrum and FM spectrum signals.

DETAILED DESCRIPTION

Figure 1A:
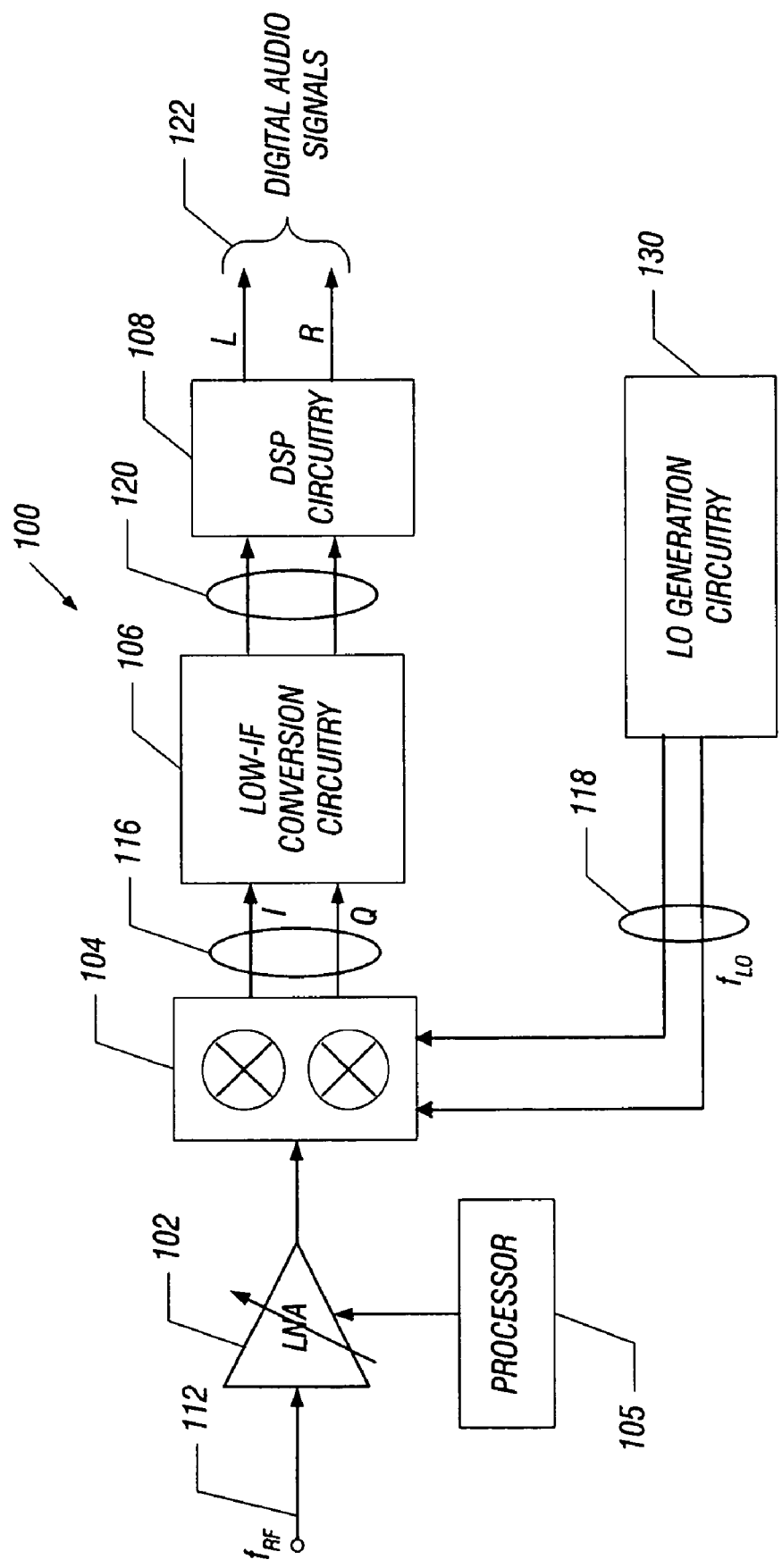
FIG. 1A is a block diagram of an embodiment of an integrated receiver that utilizes a low-IF architecture.

FIG. 1A is a block diagram of an embodiment 100 for an integrated terrestrial broadcast receiver that utilizes a low-IF architecture. The input signal spectrum ($f_{RF}$) 112 is expected to be a radio frequency (RF) signal spectrum that includes a plurality of channels that can be tuned. It is noted that as used herein, a "radio frequency" or RF signal means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. More particularly, the embodiments can provide an advantageous architecture for an FM terrestrial broadcast receiver. For purposes of the description below, therefore, the RF signal spectrum ($f_{RF}$) 112 will be discussed primarily with respect to the RF signal spectrum ($f_{RF}$) 112 being an FM terrestrial broadcast spectrum that includes a plurality of different FM broadcasts channels centered at different broadcast frequencies.

Looking back to the embodiment 100 in FIG. 1A, a low noise amplifier (LNA) 102 receives the RF signal spectrum ($f_{RF}$) 112. As will be described further below, LNA 102 may be digitally controlled by a processor 105, which may be a microcontroller in some embodiments. Unlike conventional receivers, processor 105 may also be used to perform automatic gain control (AGC) for receiver 100 instead of the AGC being provided by analog circuitry. Processor 105 includes a processing core that executes instructions (stored in a memory, for example, of the processor) for purposes of sensing various gains and other parameters of receiver 100 and controlling LNA 102 (and other portions) of receiver 100 accordingly. In some embodiments of the invention, processor 105 may be a microcontroller, such as a microcontroller based on the 8051 instruction set. However, a processor other than a microcontroller as well as a different type of microcontroller may be used in other embodiments of the invention.

In some embodiments of the invention, processor 105 and components of the RF and IF processing chain (described further below) may be integrated on the same semiconductor die (i.e., substrate) and thus may be part of the same semiconductor package or integrated circuit (IC). In other embodiments of the invention, processor 105 may be part of the same semiconductor package as the components of the RF/IF chain but located on a separate die. In still other embodiments of the invention, processor 105 and RF/IF chain components may be located in different semiconductor packages. Thus, many variations are possible and are within the scope of the appended claims.

Still referring to FIG. 1A, the output of LNA 102 is then applied to a mixer 104, and mixer 104 generates real (I) and imaginary (Q) output signals, as represented by signals 116. To generate these low-IF signals 116, the mixer 104 uses phase shifted local oscillator (LO) mixing signals ($f_{LO}$) 118. The LO generation circuitry 130 includes oscillation circuitry and outputs the two out-of-phase LO mixing signals ($f_{LO}$) 118 that are used by the mixer 104. The outputs of mixer 104 are at a low-IF, which can be designed to be fixed or may be designed to vary, for example, if discrete step tuning is implemented for the LO generation circuitry 130. An example of large step LO generation circuitry that utilizes discrete tuning steps is described in the co-owned and co-pending U.S. patent application Ser. No. 10/412,963, which was filed Apr. 14, 2003, which is entitled "RECEIVER ARCHITECTURES UTILIZING COARSE ANALOG TUNING AND ASSOCIATED METHODS," and which is hereby incorporated by reference in its entirety Low-IF conversion circuitry 106 receives the real (I) and imaginary (Q) signals 116 and outputs real and imaginary digital signals, as represented by signals 120. The low-IF conversion circuitry 106 preferably includes band-pass or low-pass analog-to-digital converter (ADC) circuitry that converts the low-IF input signals to the digital domain. And the low-IF conversion circuitry 106 provides, in part, analog-to-digital conversion, signal gain and signal filtering functions. Further digital filtering and digital processing circuitry with the digital signal processing (DSP) circuitry 108 is then used to farther tune and extract the signal information from the digital signals 120. The DSP circuitry 108 then produces baseband digital output signals 122. When the input signals relate to FM broadcasts, this digital processing provided by the DSP circuitry 108 can include, for example, FM demodulation and stereo decoding. Digital output signals 122 can be left (L) and right (R) digital audio output signals 122 that represent the content of the FM broadcast channel being tuned, as depicted in the embodiment 100 of FIG. 1A. It is noted that the output of the receiver 100 can be other desired signals, including, for example, low-IF quadrature I/Q signals from an analog-to-digital converter that are passed through a decimation filter, a baseband signal that has not yet been demodulated, multiplexed L+R and L−R audio signals, L and R analog audio signals, and/or any other desired output signals.

It is noted that as used herein low-IF conversion circuitry refers to circuitry that in part mixes the target channel within the input signal spectrum down to a fixed IF frequency, or down to a variable IF frequency, that is equal to or below about three channel widths. For example, for FM broadcasts within the United States, the channel widths are about 200 kHz. Thus, broadcast channels in the same broadcast area are specified to be at least about 200 kHz apart. For the purposes of this description, therefore, a low-IF frequency for FM broadcasts within the United States would be an IF frequency equal to or below about 600 kHz. It is further noted that for spectrums with non-uniform channel spacings, a low-IF frequency would be equal to or below about three steps in the channel tuning resolution of the receiver circuitry. For example, if the receiver circuitry were configured to tune channels that are at least about 100 kHz apart, a low-IF frequency would be equal to or below about 300 kHz. As noted above, the IF frequency may be fixed at a particular frequency or may vary within a low-IF range of frequencies, depending upon the LO generation circuitry 130 utilized and how it is controlled. In other embodiments, other types of down conversion from RF signals to baseband may be effected.

It is further noted that the architecture of the present invention can be utilized for receiving signals in a wide variety of signal bands, including AM audio broadcasts, FM audio broadcasts, television audio broadcasts, weather channels, television signals, satellite radio signals, global positioning signals (GPS), and other desired broadcasts, among many other signal types.

Figure 1B:
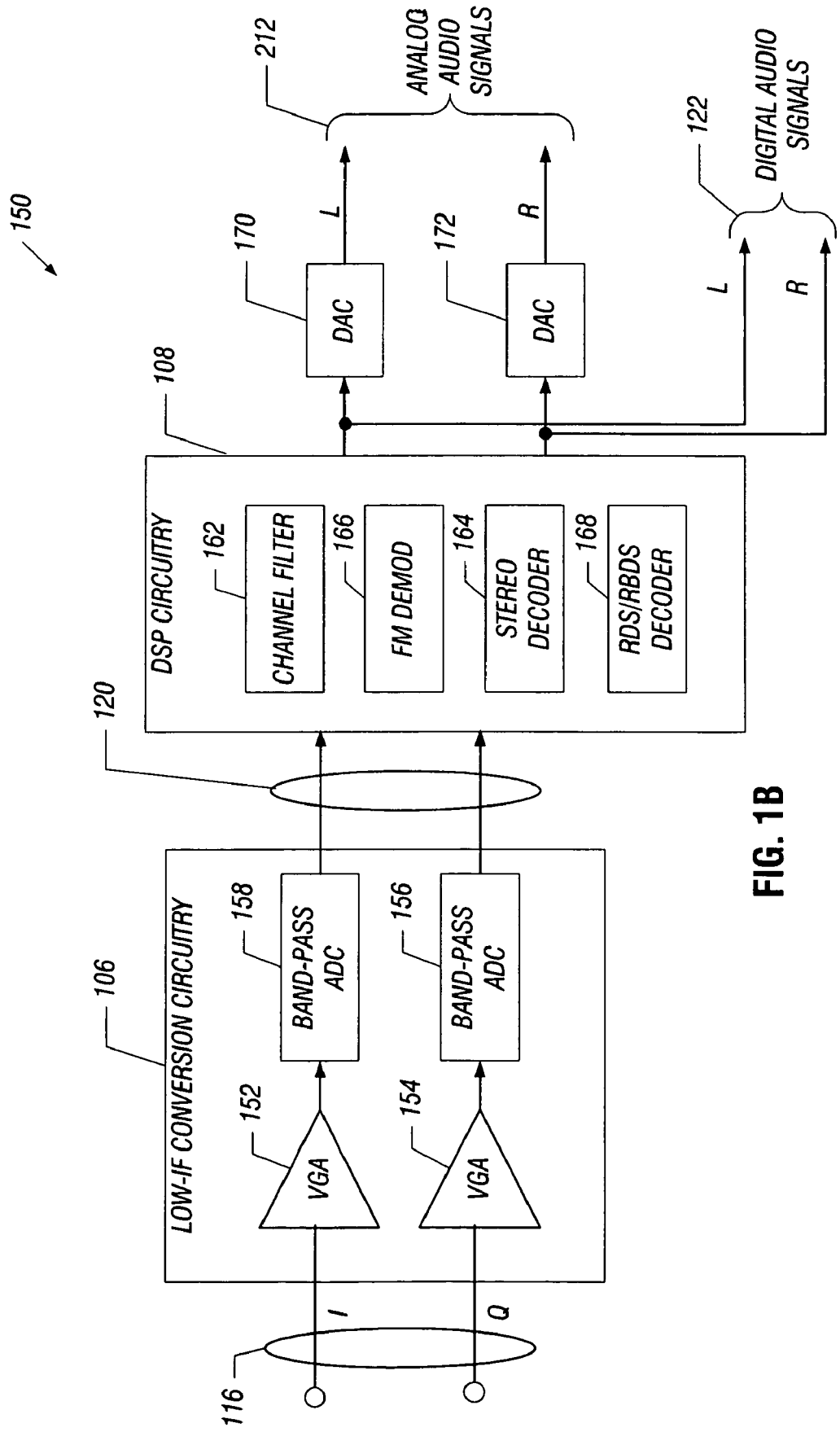
FIG. 1B is a more detailed block diagram for the low-IF circuitry and the DSP circuitry of FIG. 1A.

FIG. 1B is a more detailed block diagram for the low-IF circuitry 106 and the DSP circuitry 108 of FIG. 1A where the receiver circuitry is utilized for an integrated FM terrestrial broadcast receiver. More particularly, in the embodiment 150 of FIG. 1B, the low-IF circuitry 106 includes variable gain amplifiers (VGAs) 152 and 154 that receive the real (I) and imaginary (Q) signals 116 that have been mixed down to a low-IF frequency by mixer 104. The output of VGA 152 is then converted from low-IF to the digital domain using band-pass ADC 158. Similarly, the output of VGA 154 is converted from low-IF to the digital domain using band-pass ADC 156. Together, the ADCs 156 and 158 produce the real (I) and imaginary (Q) digital output signals 120. The DSP circuitry 108 conducts digital processing in the digital domain to further tune the target channel. More particularly, the low-IF DSP circuitry 108 utilizes a channel selection filter, as represented by the channel filter block 162, to further tune the target channel. As indicated above, the DSP circuitry 108 can also implement digital processing to provide FM demodulation of the tuned digital signals, as represented by FM DEMOD block 166, and can implement stereo decoding, such as MPX decoding, as represented by stereo decoder block 164. In addition, embodiment 150 can tune and decode RDS (Radio Data System) and/or RBDS (Radio Broadcast Data System) information utilizing in part the RDS/RBDS decoder 168 within the DSP circuitry 108. The output signals from the low-IF DSP circuitry 108 are left (L) and right (R) digital audio signals 122. If desired, integrated digital-to-analog converters (DACs), such as DACs 170 and 172, can be utilized to convert these digital audio signals to left (L) and right (R) analog audio signals 212. It is also noted that, if desired, ADCs 156 and 158 could also be implemented as complex bandpass ADCs, as real low-pass ADCs, or as any other desired ADC architecture.

As indicated above, the architectures of the present invention are advantageous for small, low-cost portable devices and are particularly advantageous for such devices that need to receive terrestrial audio broadcasts, such as FM broadcasts. In particular, the LO generation circuitry 130, the mixer 104, the low-IF conversion circuitry 106 and the DSP circuitry 108 are preferably all integrated on the same integrated circuit. In addition, the LNA 102 and other desired circuitry can also be integrated into the same integrated circuit. This integrated circuit can be made, for example, using a complementary metal oxide semiconductor (CMOS) process, a BiCMOS process, or any other desired process or combination of processes. In this way, for example, a single integrated circuit can receive a terrestrial broadcast signal spectrum and output digital or analog audio signals related to a tuned terrestrial broadcast channel. Preferably, the integrated circuit is a CMOS integrated circuit, and may be configured to provide advantageous cost, size and performance features for small, portable devices, such as cellular handsets, portable audio devices, MP3 players, portable computing devices, and other small, portable devices.

Power consumption is an additional concern with such small, portable devices. Embodiments of the integrated receiver architecture may advantageously provide for reduced power consumption and allow for the use of power supplies with different ranges to power the integrated receiver. In particular, the present invention allows for low current consumption of less than or equal to 30 mA (milli-Amps) of supply current. In addition, the level of integration provided by embodiments of the present invention allows for a small package size and reduced number of external components.

Figure 1C:
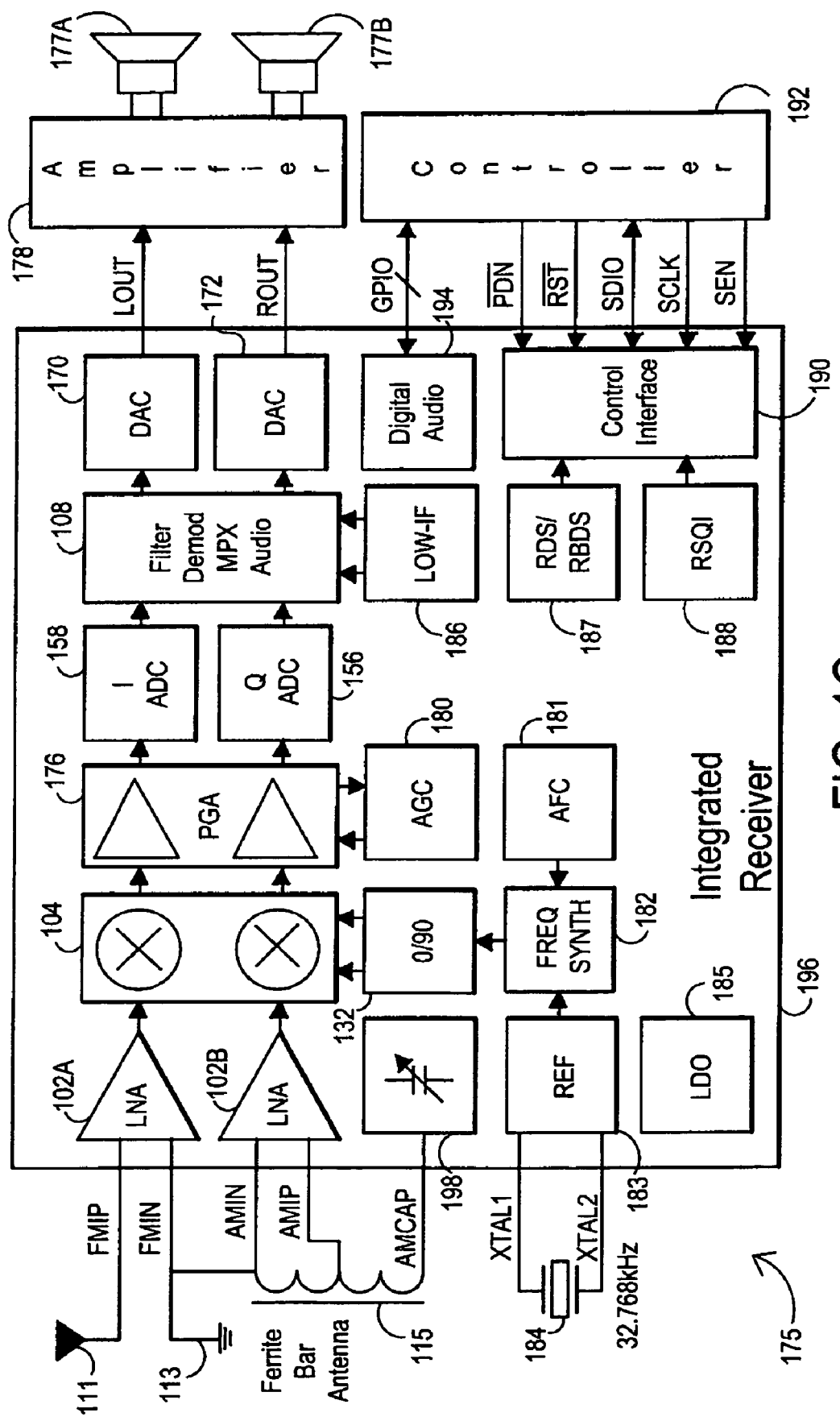
FIG. 1C is a block diagram of one example embodiment of an integrated receiver.

FIG. 1C is a block diagram of one example embodiment 175 for an integrated terrestrial broadcast receiver 196. In the embodiment depicted, the integrated receiver 196 includes an AM antenna and an FM antenna. The FM antenna 111 provides a differential FM input signal, which is represented by signals FMIP (FM input positive) and FMIN (FM input negative), to a first low noise amplifier (LNA) 102A. The FMIN node is coupled to ground 113. The AM antenna 115 provides a differential AM input signal, which is represented by signals AMIP (AM input positive) and AMIN (AM input negative), to a second low noise amplifier (LNA) 102B. While not shown for simplicity in FIG. 1C, it is to be understood that LNA's 102A and 102B may be digitally controlled, as described further herein. The AMIN node is coupled to ground 113. The AM antenna 115, as depicted, is a ferrite bar antenna, and the AM reception can be tuned using an on-chip variable capacitor circuit 198. The connection between the on-chip variable capacitor circuit 198 and the AM antenna 115 is represented by the AMCAP signal. It is also noted that the FM antenna reception can also be tuned with an on-chip variable capacitor circuit, if desired. With respect to the power supply for the integrated receiver 196, an integrated supply regulator (LDO) block 185 can be provided to help regulate the on-chip power.

As with FIG. 1A, the outputs of the LNAs 102A and 102B are processed by mixer 104 to generate real (I) and an imaginary (Q) signals. These signals are the processed by a programmable gain amplifier (PGA) 176, which is controlled by the automatic gain control (AGC) block 180. The output signals from the PGA 176 are then converted to digital I and Q values with I-path ADC 158 and Q-path ADC 156. DSP circuitry 108 then processes the digital I and Q values to produce left (L) and right (R) digital audio output signals that can be provided to the digital audio block 194. In addition, these left (L) and right (R) digital audio output signals can be processed with additional circuitry, as represented by digital-to-analog conversion (DAC) circuits 170 and 172, to produce left (LOUT) and right (ROUT) analog output signals. These analog output signals can then be output to listening devices, such as headphones. Amplifier 178 and speaker outputs 177A and 177B, for example, can represent headphones for listening to the analog audio output signals. As described above with respect to FIG. 1B, the DSP circuitry 108 can provide a variety of processing features, including digital filtering, FM and AM demodulation (DEMOD) and stereo/audio decoding, such as MPX decoding. Low-IF block 186 includes additional circuitry utilized to control the operation of the DSP circuitry 108 in processing the digital I/Q signals.

A digital control interface 190 can also be provided within integrated receiver 196 to communicate with external devices, such as controller 192. As depicted, the digital communication interface includes a power-down (PDN_) input signal, reset (RST_) input signal, a bidirectional serial data input/output (SDIO) signal, a serial clock input (SCLK) signal, and a serial interface enable (SEN) input signal. As part of the digital interface, digital audio block 194 can also output digital audio signals to external devices, such as controller 192. As depicted, this communication is provided through one or more general programmable input/output (GPIO) signals. The GPIO signals represent pins on the integrated receiver 196 that can be user programmed to perform a variety of functions, as desired, depending upon the functionality desired by the user. In addition, a wide variety of control and/or data information can be provided through the interface 190 to and from external devices, such as controller 192. For example, a RDS/RBDS block 187 can report relevant RDS/RBDS data through the control interface 190. And a receive strength quality indicator block (RSQI) 188 can analyze the receive signal and report data concerning the strength of that signal through the control interface 190. It is noted that other communication interfaces could be used, if desired, including serial or parallel interfaces that use synchronous or asynchronous communication protocols.

Looking back to the mixer 104 of FIG. 1C, LO mixing signals are received by mixer 104 from a phase shift block (0/90) 132 that produces two mixing signals that are 90 degrees out of phase with each other. The phase shift block 132 receives an oscillation signal from frequency synthesizer (FREQ SYNTH) 182. Frequency synthesizer 182 receives a reference frequency from reference frequency (REF) block 183 and a control signal from automatic frequency control (AFC) block 181. An external crystal oscillator 184, operating, for example, at 32.768 kHz, provides a fixed reference clock signal to the reference frequency (REF) block 183 through connections XTAL1 and XTAL2. The AFC block 181 can receive tuning error signal from the receive path circuitry within the integrate receiver 196 and provide a correction control signal to the frequency synthesizer 182.

In various embodiments, an LNA may be provided that has an impedance unmatched to a source impedance. Furthermore, the LNA impedance may be a high impedance and can be substantially greater than the source impedance. In some embodiments, a ratio between the amplifier impedance and the source impedance may be at least approximately 2:1 and may extend to greater than 10:1, although the scope of the present invention is not so limited. In some certain particular embodiments, a ratio between antenna impedance and source impedance may be approximately between 2:1 and 4:1.

Furthermore, an LNA core in accordance with an embodiment of the present invention may be implemented using a metal-oxide-semiconductor field-effect-transistor (MOSFET) technology, allowing integration of many components within a single integrated circuit, such as an on-chip processor to digitally control the LNA core and other associated components.

Figure 2:
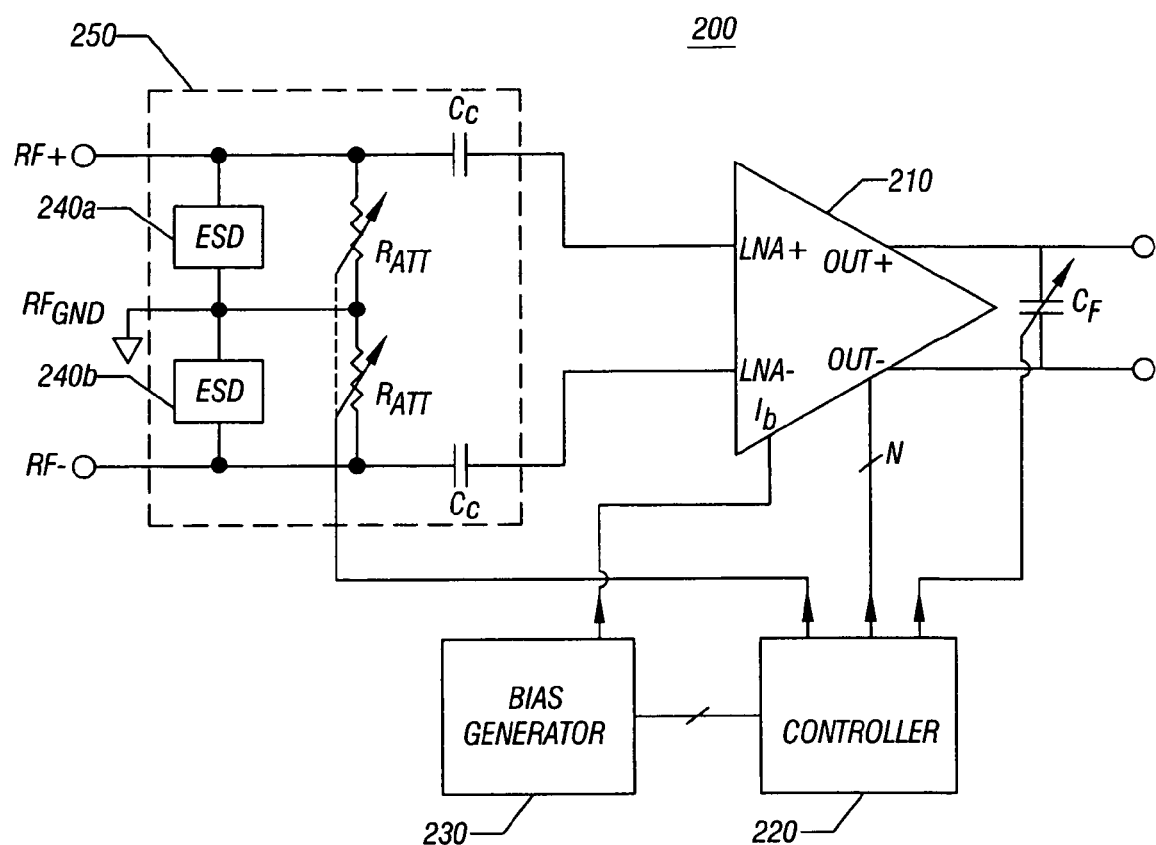
FIG. 2 is a block diagram of a portion of a receiver in accordance with an embodiment of the present invention.

Referring now to FIG. 2, shown is a block diagram of a portion of a receiver 200 in accordance with an embodiment of the present invention. Specifically, FIG. 2 shows an LNA core 210 and related support circuitry. While shown in FIG. 2 as having a differential implementation, a single-ended implementation or an implementation combining single-ended and differential signals may also be effected.

Essentially, LNA core 210 is controlled via a controller 220, which may provide a plurality of digital control signals to LNA core 210 to control its operation. Specifically, as shown in FIG. 2, controller 220 may output N bits to control operation of LNA core 210. Controller 220 may correspond to processor 105 of FIG. 1A, for example. In various embodiments, controller 220 may be integrated on a single integrated circuit with LNA core 210 and the related circuitry shown in FIG. 2, in addition to other components not shown in FIG. 2. In other embodiments, controller 220 may be off-chip and one or more of the settings controlled by controller 220 may be manually set or controlled via another source. As further shown in FIG. 2, controller 220 is coupled to provide digital control signals to a bias generator 230. Based on these control signals, bias generator 230 may generate a bias current that is provided to LNA core 210 as a bias current, $I_b$.

The support circuitry for LNA core 210 further includes an input stage 250 that is coupled between input nodes and the input to LNA core 210. As shown in FIG. 2, the incoming RF signal at the input nodes may take the form of a differential signal pair including a positive and negative portion of the RF signal (i.e., RF+ and RF−). The incoming RF signal may be received from an antenna. Because embodiments of the present invention permit flexibility as the high input impedance LNA may be completely unmatched to a source impedance, the antenna may be of any antenna design and impedance level used for a desired application. For example, the antenna may take the form of a half wavelength dipole antenna, an antenna of a different length or type, and may be of virtually any equivalent source impedance.

Input stage 250 may include various components to provide electrostatic discharge protection (ESD) and different attenuation levels, as well as to provide a DC block with respect to incoming signals. In the embodiment shown in FIG. 2, input stage 250 may include a pair of ESD circuits 240a and 240b coupled between the input node and a reference potential. Specifically, as shown in FIG. 2 the reference potential may be a ground potential, such as an RF signal ground (i.e., RFGND) provided via a pin connection of the IC device. Furthermore, input stage 250 may include an attenuation network coupled between the input node and the reference potential. As shown in FIG. 2, in some embodiments the attenuation network may be formed of adjustable resistances (i.e., $R_{ATT}$), a pair of which may be coupled between a respective differential input and the reference potential. The attenuation network may also be digitally controlled via controller 220.

Input stage 250 further includes a coupling capacitance coupled between the input node and the input to LNA core 210. In the embodiment shown in FIG. 2, a pair of coupling capacitors $C_C$ each may be coupled between a respective differential input node and a differential input of LNA core 210. In various embodiments, the coupling capacitance may be used to couple an AC voltage to LNA core 210, while blocking any DC voltage. The coupling capacitors $C_C$ may form a high-pass filter with the input impedance of LNA core 210. The cut-off frequency may be determined with reference to Eq. 1:

$$F_{cut\text{-}off} = \frac{1}{2\pi C_C \times R_N} \quad \text{(Eq. 1)}$$

where $R_N$ is the input resistance of LNA core 210 and $C_C$ is the coupling capacitance.

By setting LNA core 210 with a high input resistance, the use of a small coupling capacitor may be realized. As an example, the input resistance of LNA core 210 may be between approximately 1 k and 100 k ohms in an embodiment used for an FM receiver, although different values are possible in these and other embodiments. Due to the small capacitance value, in various embodiments the coupling capacitor(s) may be located on the same IC as LNA core 210. In various embodiments, each coupling capacitor may have a capacitance between 1 and 50 picofarads (pF), although the scope of the present invention is not so limited. If instead the input impedance of LNA core 210 were required to be matched to an antenna having a source impedance of 50 ohms, for example, the coupling capacitor would be much larger and could not easily be accommodated on-chip. If implemented off-chip, these larger capacitors would add cost and size to a radio tuner. Furthermore, such off-chip capacitor(s) would increase parasitic coupling, impeding performance.

By using an on-chip coupling capacitor, the input pins (i.e., RF+ and RF−), ESD circuits 240a and 240b and the input attenuator network may be referenced to a signal ground potential while the inputs to LNA core 210 may be at the bias voltage of the amplifier. By presence of the coupling capacitors, the DC potential is held on the capacitors with no DC current flow. Furthermore, better performance may be obtained by coupling the ESD circuits 240a and 240b and the input attenuation network to a reference voltage different than the amplifier voltage. In one embodiment, the reference voltage may be obtained from an off-chip source, such as a ground plane of an associated circuit board via a pin of the integrated circuit.

Bias generator 230 may be controlled via controller 220 to set the bias of LNA core 210. By changing the value of the control signals (e.g., a digital word), the bias current, $I_b$, may be adjusted. In such manner, the properties of LNA core 210 may be changed in a desired manner. In other embodiments, such adjustments may adjust for process and temperature variations. For example, controller 220 may receive information regarding process and temperature and access a lookup table to provide an appropriate adjustment to bias current, $I_b$.

In various embodiments, the bias current may be controlled to reduce power consumption. While a small amount of sensitivity may be sacrificed, significant power savings may be realized. As will be discussed further below, in some embodiments when the bias current is adjusted to reduce power consumption, controller 220 may also send one or more control bits to LNA core 210 to adjust device size. In such manner, current density may remain constant while reducing the bias current. However, in other embodiments device size may be controlled independently of bias current.

To maintain a constant gain in different power modes, controller 220 may also provide digital control signals to LNA core 210 to control its nominal output resistance. Still further, controller 220 may send control signals to LNA core 210 to control the gain in an upward or downward manner from a nominal setting. In some embodiments, the output resistance may be controlled to adjust the gain. While reducing the gain of the LNA in the presence of large signals may slightly degrade noise performance, interference rejection performance may be significantly improved, in some embodiments. Gain control may take the form of an automatic gain control (AGC) function that may be implemented within controller 220. However, in other embodiments control signals from another location of a system may be provided to LNA core 210 to control gain.

Still referring to FIG. 2, a filter capacitor, $C_F$, is shown coupled between the differential outputs (i.e., Out+ and Out−) of LNA core 210. The filter capacitor may be a tunable capacitance controlled by controller 220. In various embodiments, the filter capacitor may limit the bandwidth of the LNA to aid in reducing interfering signals located outside of a desired band. The filter capacitor forms a pole with a load resistance within LNA core 210.

The filter capacitor may be controlled by controller 220 to have a bandwidth in accordance with the frequency of the signal of interest. In other words, the filter capacitor may be controlled based on a frequency band of interest and/or a particular channel within the frequency band. However, by varying the power mode or controlling the gain of the LNA, a change in the bandwidth of LNA core 210 may occur. By controlling the filter capacitor, the LNA bandwidth may be maintained at a desired level for the received signals.

Figure 3:
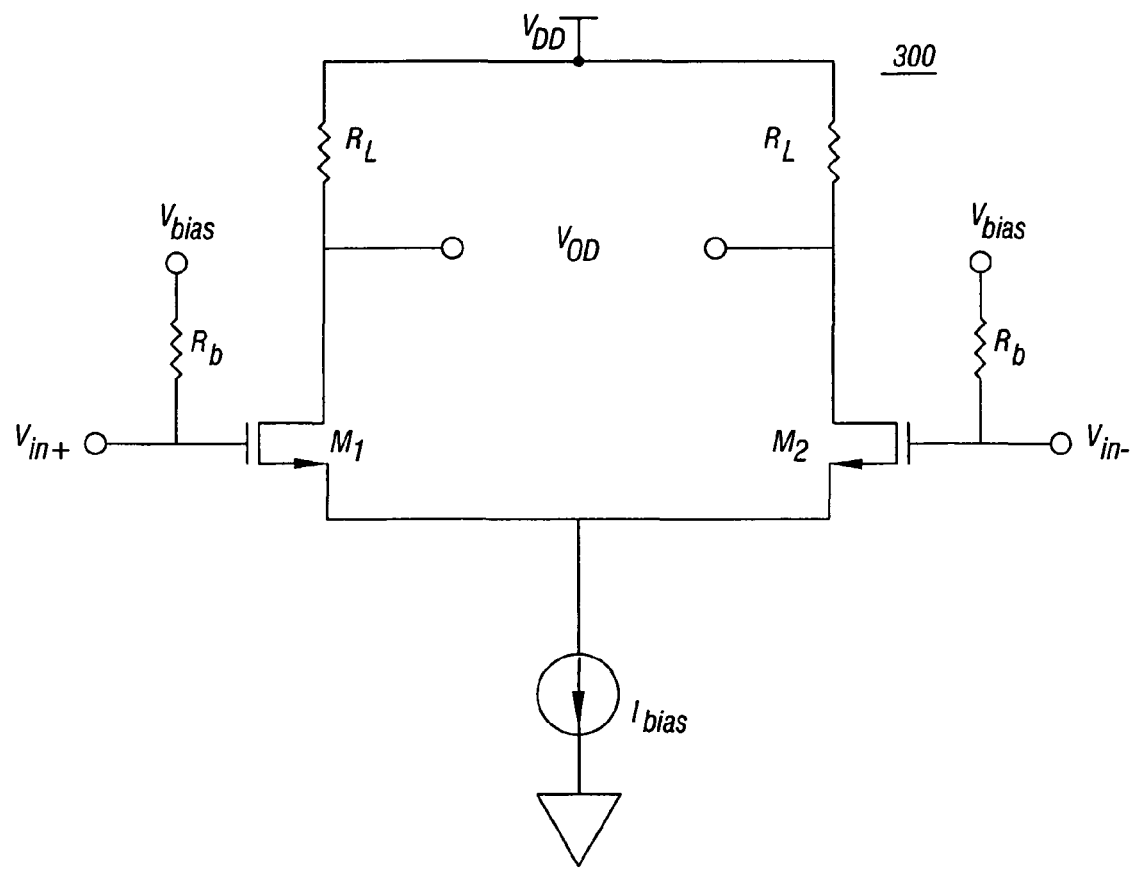
FIG. 3 is a schematic diagram of a high impedance LNA core in accordance with an embodiment of the present invention.

Referring now to FIG. 3, shown is a schematic diagram of a high impedance LNA core in accordance with an embodiment of the present invention. As shown in FIG. 3, LNA core 300 may be formed as a differential network, although in other embodiments a single-ended amplifier may be used. As shown in FIG. 3, LNA core 300 includes a pair of MOSFETs M1 and M2, which may be n-channel MOSFETs. The gates of MOSFETs M1 and M2 are coupled to a respective differential input, $V_{in+}$ and $V_{in-}$. These RF signals may be obtained from input stage 250 of FIG. 2, as an example. As further shown, a negligible bias resistance, $R_b$, is also coupled to the gates and is supplied with a bias voltage, $V_{bias}$. $V_{bias}$ can be generated in different manners. As an example, a resistor divider between a supply voltage, $V_{dd}$, and ground may be present. Another manner of generating the bias voltage is with a voltage reference such as a bandgap voltage generator, and this voltage can also be divided with a voltage divider. The bias resistance may thus set the desired bias voltage for LNA core 300. In some embodiments, the bias voltage may be between approximately 1-2 volts.

Because of the insulated gate in a MOSFET device, the LNA input impedance is almost entirely capacitive, with the negligible bias resistance shown. In various embodiments, the bias resistance may be chosen to be much larger than the source impedance, for example between 1 k and 100 kΩ. In such manner, this bias resistance does not have a significant effect on the input impedance. It is to be noted that the attenuator resistors may reduce the overall input resistance seen by the antenna from these figures in the presence of large signals.

As further shown in FIG. 3, the sources of MOSFETs M1 and M2 may be coupled to the bias current, $I_{bias}$. The drains of MOSFETs M1 and M2 may be coupled to the supply voltage, $V_{dd}$, via respective load resistances, $R_L$. Furthermore, the outputs of the differential stage, $V_{OD}$, may also be coupled between the drains and load resistances.

In various embodiments, LNA core 300 may be controlled using digital signals received from a controller, such as controller 210 of FIG. 2. Because of the flexible topology used and the control available, all components may be designed to be optimized by the controller based upon the RF signals being received. In some embodiments, transistor device size, bias current, and load resistance may all be adjustable. In such manner, flexibility in the gain, power level, and intermodulation properties of the LNA may be accommodated.

There may be many different manners of adjusting device size, bias current, and load resistance to obtain desired operating parameters according to an incoming RF signal, power levels and the like. In some embodiments, one or more of these parameters may be adjustable using switches to add or remove components and devices into the circuit.

Figure 4:
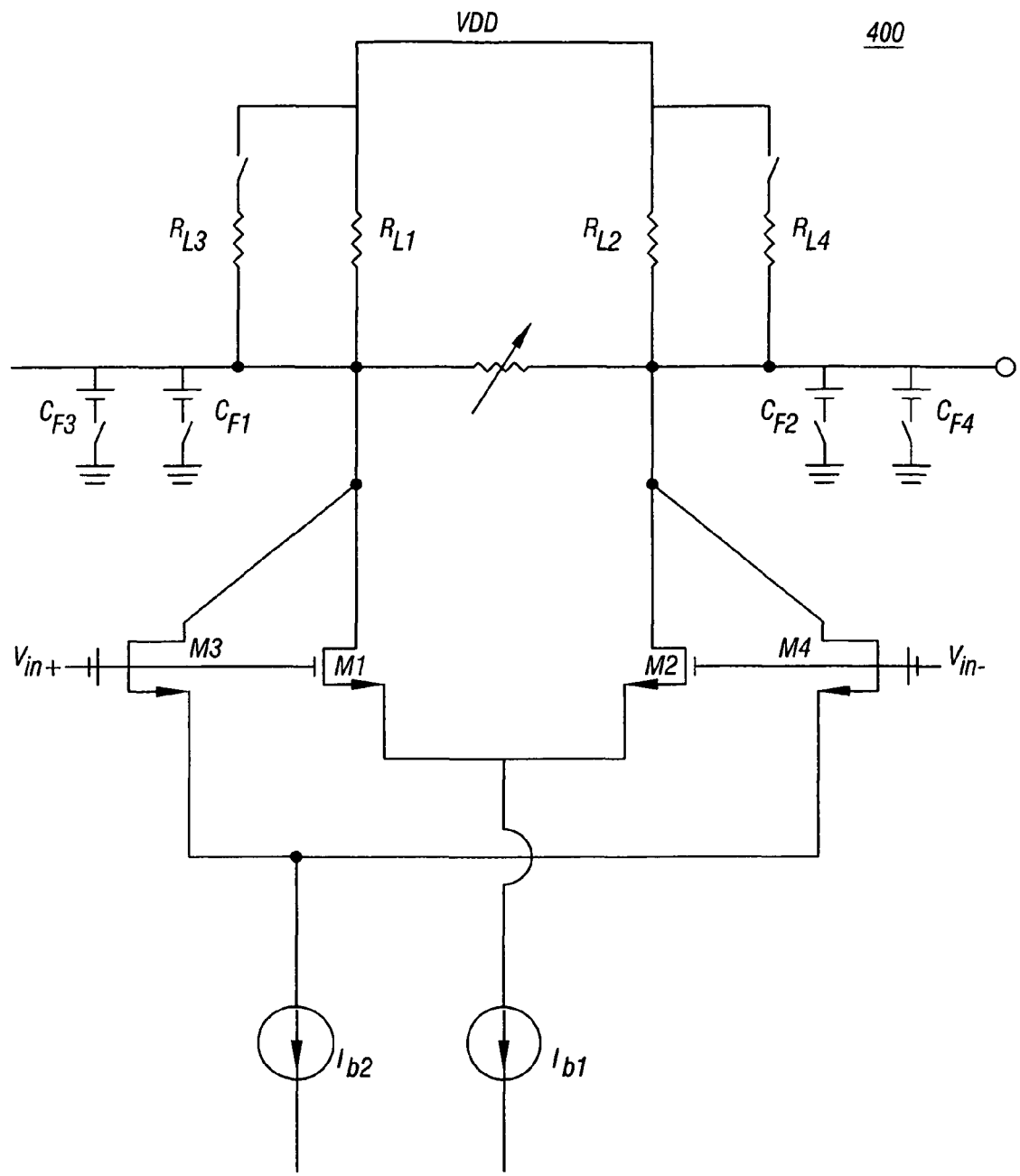
FIG. 4 is a schematic diagram of one embodiment of an LNA core providing adjustability.

For example, referring now to FIG. 4 shown is one embodiment of an LNA core providing adjustability. As shown in FIG. 4, LNA core 400 is a differential implementation including a plurality of MOSFETs, namely four n-channel MOSFETs M1-M4. Each of the MOSFETs has sources coupled to a bias current. Specifically, MOSFETs M1 and M2, which are part of a primary path (e.g., a signal path that is to remain on regardless of operating conditions), are coupled to a first bias current, $I_{b1}$. MOSFETs M3 and M4, which may be part of a secondary path that is a path that may be switched in or out of the circuit depending upon desired operating parameters, may have sources coupled to a second bias current, $I_{b2}$. Power dissipation may thus be controlled by turning off one of these two bias currents, thus reducing power dissipation. Each of transistors M1-M4 has a gate coupled to receive an incoming RF signal. The drains of MOSFETs M1-M4 are coupled through load resistances to a supply voltage, $V_{dd}$. As shown in FIG. 4, load resistances $R_{L1}$ and $R_{L2}$ may remain as part of the primary path, regardless of operating parameters, while load resistances $R_{L3}$ and $R_{L4}$ may be switched into and out of the circuit, as dictated by desired operating parameters. Furthermore, a variable resistance is shown coupled in parallel between load resistances $R_{L1}$ and $R_{L2}$. In some embodiments, this variable resistance may be implemented as a plurality of transistors that are switched into and out of the circuit. The variable resistance may also be digitally controlled (e.g., by controller 210 of FIG. 2). The adjustable resistance may be coupled to an output path of LNA core 400, which includes a filter capacitance. In some embodiments, the primary path and the secondary path may be formed of substantially identical components. Thus both paths can be switched on and off. In still other embodiments, there can be more than two paths.

For example, four paths may be provided to attain finer control, and the multiple paths need not be formed of the same size devices.

As shown in FIG. 4, a plurality of filter capacitors $C_{F1}$-$C_{F4}$ may be provided to filter the output signal from LNA core 400. In some embodiments, one or more such filters may be switched into or out of the circuit depending upon the desired operating parameters. While shown with a particular implementation of FIG. 4, it is to be understood that the scope of the present invention is not so limited, and in other embodiments additional components may be provided and switched into and out of the circuit. Still further, different configurations and devices for controlling operating parameters may be implemented, in some embodiments.

Figure 5:
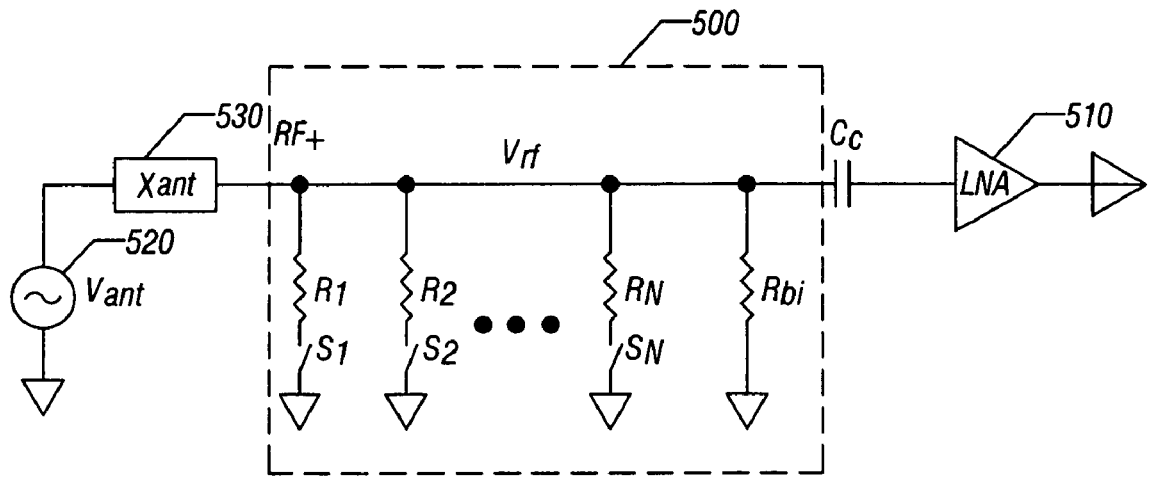
FIG. 5 is a schematic diagram of an input attenuation network in accordance with an embodiment of the present invention.

As described above, in some embodiments an input attenuation network may be present. Referring now to FIG. 5, shown is a block diagram of an input attenuation network in accordance with an embodiment of the present invention. As shown in FIG. 5, an input attenuation network 500 is coupled to an input node (RF$_+$) coupled between an antenna and an LNA core 510. For simplicity, a single-ended representation is shown in FIG. 5, but the function is extendable to a differential configuration. Also shown in FIG. 5, the antenna may be modeled as a voltage source, $V_{ANT}$ 520 and a source impedance 530.

As shown in FIG. 5, input attenuator network 500 may be formed of a plurality of resistors $R_1$-$R_N$, controlled by a respective one of a plurality of switches $S_1$-$S_N$. Attenuator network 500 further includes a fixed resistance $R_{bi}$. In one embodiment, $R_{bi}$ may be 20 kΩ, although the scope of the present invention is not so limited. Attenuator network 500 may reduce the RF signal (voltage or power) that is received by LNA core 510. For example, based on the strength of the received RF signal, controller 210 of FIG. 2 (for example) may switch in or out one or more of resistances $R_1$-$R_N$. These resistances may have different values, ranging from approximately 2.5Ω to 5 kΩ, in some embodiments.

Coupled between the input node and LNA core 510 is a coupling capacitor $C_C$. An antenna signal is by nature an AC coupled signal and cannot set a DC voltage at the antenna output node (also corresponding to node RF+ in FIG. 5). Thus $R_{bi}$ is provided to set the DC level of the input node if no attenuation resistors are turned on. In one embodiment, the DC level may correspond to RFGND.

The model of the antenna is an RF voltage source, $V_{ANT}$, from a reference node (e.g., ground) in series with source impedance 530, $X_{ANT}$. The input attenuator network forms a voltage divider with the antenna reactance. The attenuated voltage is given by:

$$V_{RF} = V_{ANT} * (R_{ATT}/(X_{ANT}+R_{ATT}))$$ (Eq. 2)

where $R_{ATT}$ represents the total resistance that is connected (i.e., switched in) between nodes RF+ and ground. Note that if the LNA was designed to match the antenna impedance, this attenuation method could not be used as it would change the overall LNA input impedance and frustrate the intent of impedance matching.

Note that if the AC coupling capacitor(s) were not present, node RF+ would be at a DC voltage used to bias the input device of the LNA, typically a volt or two above ground. The attenuator network 500 of FIG. 5 would undesirably affect LNA core 510, as DC current would flow to ground through the resistors. This current would alter the bias of the amplifier depending on the amount of attenuation selected, and would degrade performance significantly. To avoid this degradation, the attenuator resistors would conventionally be connected to the same voltage as the amplifier bias. However, this would complicate the design of the bias circuitry, would complicate the switches used, and could degrade RF performance.

In one embodiment, the attenuator resistors and switches are implemented with an approximately binary weighted array of resistive elements, with MOSFET switches controlled by a processor, such as controller 210 of FIG. 2. For some of the branches, the MOSFET itself may act as the resistive element, while in other branches physical resistors are used. As shown in FIG. 5, one fixed resistor, $R_{bi}$, may be used to provide a DC reference to node RF+ if all the attenuating branches are off.

In the presence of large signals, a gain control circuit such as AGC block 180 of FIG. 1C can switch in resistance of input attenuator network 500 until the signal swing has reached an acceptable level. Switching in these resistors may add some noise, degrading performance slightly. However, because distortion is caused by a high order function, such as $RF^3$, a small reduction in the RF signal results in a drastic reduction of interfering signals, and improved reception, in many situations.

In portable applications, the antenna impedance cannot be well controlled and can vary over a wide range. The input attenuator range is designed to provide acceptable levels of attenuation over a wide range of antenna impedances. For example, attenuation ranges between approximately 30Ω and 500Ω may be present. This impedance can be resistive, reactive or a combination of the two.

While many embodiments of the present invention contemplate unmatched impedance levels between the source and amplifier, there are some situations where having a matched input impedance is advantageous, such as in testing applications, where the test equipment has a known source impedance and long cables are used. Thus input attenuator network 500 may be designed to be able to switch in known resistance values, such as 50 and 75Ω, in some embodiments.

In some embodiments, an ESD structure may be provided that is referenced to a ground potential or other voltage not tied to a supply voltage. Conventional ESD structures typically permit a protected node to be at any voltage between a supply voltage and ground without significant current flow into the protection device(s). Such a conventional ESD structure would be used with an LNA if an on-chip coupling capacitor were not present. However, a conventional ESD structure provides a path for interfering signals from the supply voltage to the RF inputs. Because incoming RF signals may be as small as a microvolt (μV) and noise on a supply voltage can be on the order of a volt, even if a small amount of supply noise couples through the protection device, it can block the reception of desired signals.

Figure 6:
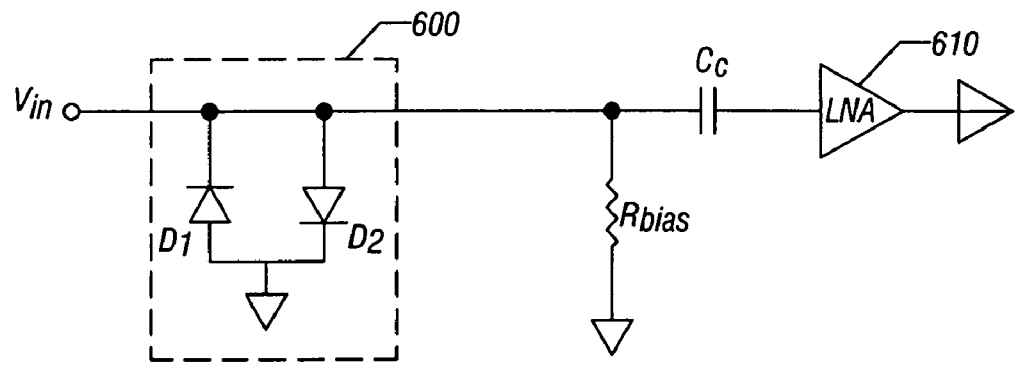
FIG. 6 is a schematic diagram of an ESD structure in accordance with an embodiment of the present invention.

Thus in various embodiments, an ESD structure may be referenced to a ground or other non-supply reference voltage. Referring now to FIG. 6, shown is a schematic diagram of an ESD structure in accordance with an embodiment of the present invention. As shown in FIG. 6, the incoming RF signal ($V_{in}$) is coupled to an ESD protection circuit 600. As further shown in FIG. 6, a bias resistance ($R_{bias}$) and a coupling capacitor $C_C$ are coupled to ESD protection circuit 600 and the input of LNA core 610. The bias resistance may correspond to the fixed resistor $R_{bi}$ of FIG. 5. For simplicity, a single-ended representation is shown in FIG. 6, but the function is extendable to a differential configuration.

As shown in FIG. 6, ESD protection circuit 600 may be formed of a pair of diodes, $D_1$ and $D_2$, coupled between the RF signal path and a ground potential. Thus ESD structure protection circuit 600 is referenced to ground only, avoiding interfering signals from the supply voltage. Coupling capacitor $C_C$ permits the input, $V_{in}$, to be at a different voltage than the amplifier bias. Bias resistor, $R_{bias}$, is used to maintain the DC voltage of $V_{in}$ at ground potential in this example. In some embodiments, this resistor may be implemented as a part of input attenuator network 500 described above in FIG. 5.

The current conducted by a diode is given by the equation Id=Is*exp(Vd/26 mV). Because Vd is zero in ESD protection circuit 600, the DC current through diodes D1 and D2 is zero. Because of the exponential nature of a diode, even a voltage of roughly 0.5V will result in a negligible current flow. The RF voltage at $V_{in}$ is expected to be 0.1V or less, especially if an AGC circuit is used, and the diodes have no effect on the RF signal. If instead coupling capacitor $C_C$ were not present, diode D2 would conduct significant current, and the bias of the LNA would be incorrect.

During an ESD event, the diodes' voltage will rise to conduct the current, but will protect the MOSFET's of the LNA core because the diodes act as clamps, conducting the ESD current to ground. In the embodiment of FIG. 6, for a positive ESD event D2 conducts, and for a negative ESD event D1 conducts.

Figure 7:
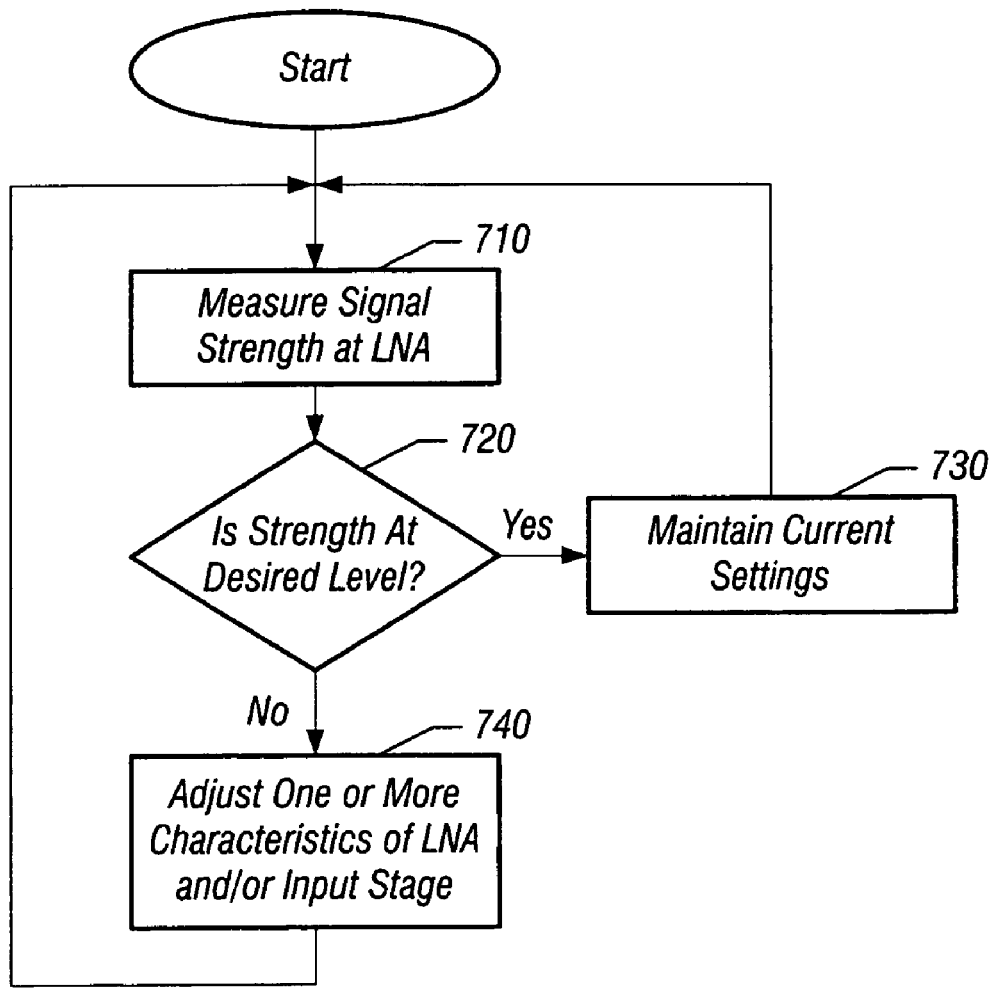
FIG. 7 is a flow diagram of a method in accordance with one embodiment of the present invention.

Referring now to FIG. 7, shown is a flow diagram of a method in accordance with one embodiment of the present invention. As shown in FIG. 7, method 700 may be used to control a receiver. Method 700 may be used to control an LNA core and an input stage coupled thereto. A system including a LNA in accordance with an embodiment of the present invention may be started up in an initial condition. Next, a signal strength may be measured at the LNA (block 710). For example, a peak detect circuit may be used to measure the signal strength. The signal strength at other locations within the receiver may also be measured, for example, at an IF stage and/or at a baseband stage. An on-chip processor may determine the RF signal strength in some embodiments. Based on these measurements, it may be determined if the signal strength is at a desired level (diamond 720). If so, the current settings may be maintained (block 730), and control returns to block 710.

If instead the strength is not at the desired level, one or more characteristics of the LNA and/or an input stage coupled thereto may be adjusted (block 740). An on-chip processor may control an input attenuation network and/or device sizes and the like to obtain desired operating characteristics, in some embodiments. For example, more or less attenuation may be switched in the input attenuation network.

Furthermore, in some embodiments it may be desirable to reduce power dissipation in the LNA. To do so, a lower current source may be provided to the LNA, and one or more corresponding components may be switched out of a circuit of the LNA. Still further, in some embodiments a gain of the LNA may be adjusted. For example, a load resistance of the LNA may be adjusted to attain a desired gain level. In some embodiments, adjustments may be made to other portions of a receiver to attain a desired signal strength. For example, a gain in a programmable gain amplifier (PGA) may also be adjusted.

While described with this particular implementation in FIG. 7, it is to be understood that the scope of the present invention is not so limited, and other methods of controlling a receiver may be implemented in different embodiments.

Figure 8:
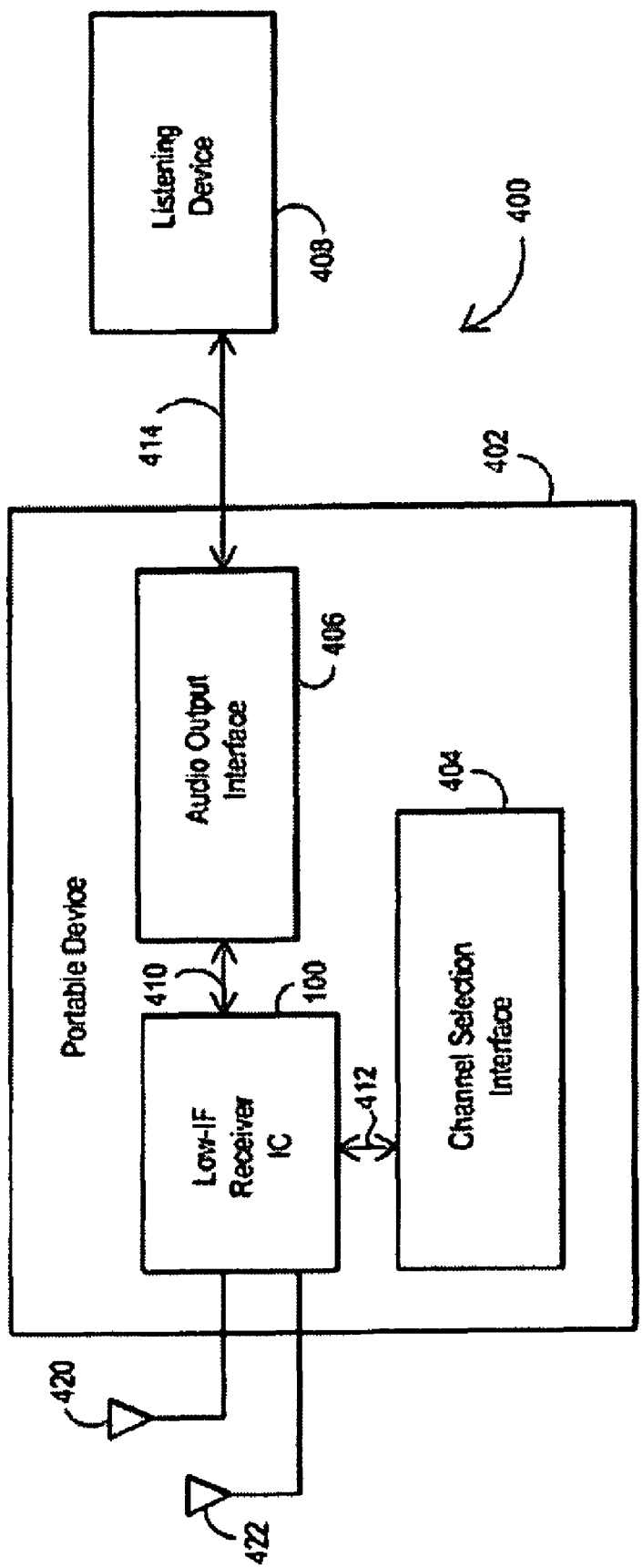
FIG. 8 is a block diagram of a portable device that utilizes a receiver according to an embodiment of the present invention.

FIG. 8 is a block diagram of an embodiment 400 for a portable device 402 that utilizes a low-IF integrated terrestrial broadcast receiver 100 according to the present invention. As depicted, the portable device includes a low-IF receiver integrated circuit 100 coupled to a channel selection interface circuitry 404 through connections 412 and to an audio output interface circuitry 406 through connections 410. The audio output interface circuitry 406 is in turn coupled to listening device 408 through connections 414. In such a portable environment, the listening device 408 is often headphones that can be easily plugged into the portable device 402. The embodiment 400 can also include one or more antennas, such as an FM broadcast antenna 420 and an AM broadcast antenna 422. It is noted that a portable device as contemplated in this embodiment is preferably a small portable device. For example, as indicated above, the small, portable device 402 could be a cellular phone, an MP3 player, a PC card for a portable computer, a USB connected device or any other small portable device having an integrated receiver. It is also noted that the audio output interface 406 can provide digital audio output signals, analog audio output signals, or both.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
a low noise amplifier having a transistor stage coupled between a supply voltage and a bias current, the transistor stage having a differential pair of transistors to receive a radio frequency (RF) input signal obtained from an antenna via an RF input node and a bias resistor coupled to each of the differential pair of transistors;
at least one resistor coupled between the RF input node and a reference potential;
at least one diode coupled between the RF input node and the reference potential;
a coupling capacitor coupled between the RF input node and the transistor stage; and
wherein the low noise amplifier has an input impedance unmatched to a source impedance of the antenna, and the low noise amplifier is coupled to the antenna without impedance matching.

2. The apparatus of claim 1, further comprising a controller to adjust the bias current, wherein the controller and the low noise amplifier are integrated in an integrated circuit.

3. The apparatus of claim 2, further comprising a filter capacitor coupled to an output of the low noise amplifier, the filter capacitor controllable by the controller.

4. The apparatus of claim 2, wherein the transistor stage comprises:
a primary path including a first differential pair of transistors each having a gate coupled to a respective differential portion of the RF input signal; and
a secondary path including a second differential pair of transistors each having a gate coupled to the respective differential portion of the RF input signal, wherein at least the secondary path is controllable by the controller to be switched into or out of a circuit of the low noise amplifier.

5. The apparatus of claim 1, wherein the input impedance is controlled based on a strength of the RF input signal.

6. The apparatus of claim 1, further comprising an input attenuator network coupled to the RF input node to adjust a strength of the RF input signal, the input attenuator network including the at least one resistor.

7. The apparatus of claim 1, wherein the low noise amplifier is operable in a plurality of power modes.

8. The apparatus of claim 1, further comprising an electrostatic protection circuit coupled to the RF input node to prevent electrostatic discharge damage to the low noise amplifier.

9. The apparatus of claim 8, wherein the electrostatic protection circuit comprises a first diode and a second diode coupled between the RF input node and the reference potential, wherein the at least one diode is one of the first and second diodes.

10. The apparatus of claim 9, wherein the RF input node is at a different potential than a bias voltage of the low noise amplifier.

11. The apparatus of claim 1, wherein the differential pair of transistors each has a gate coupled to a respective differential portion of the RF input signal.

12. A system comprising:
a low noise amplifier to generate an amplified radio frequency (RF) signal from a RF input signal obtained from an antenna, the low noise amplifier coupled to the antenna without impedance matching;
at least one resistor coupled between the antenna and a reference potential;
at least one diode coupled between the antenna and the reference potential;
a coupling capacitor coupled between the antenna and an input of the low noise amplifier;
a mixer to receive the amplified RF signal and to provide an intermediate frequency (IF) signal;
an analog-to-digital converter to convert the IF signal into a digital signal;
a controller to control operation of the low noise amplifier; and
a digital signal processor to process the digital signal.

13. The system of claim 12, wherein the system comprises a portable device.

14. The system of claim 12, wherein the antenna is coupled to the low noise amplifier and wherein the low noise amplifier is controlled by the controller to reduce a power dissipation level of the low noise amplifier.

15. The system of claim 12, wherein the amplifier, the controller and the digital signal processor are integrated on a single substrate.

16. An apparatus comprising:
a low noise amplifier coupled to receive a radio frequency (RF) signal as an input, the low noise amplifier having a primary path including a first differential pair of transistors to receive the RF signal, and a secondary path including a second differential pair of transistors to receive the RF signal, the second differential pair of transistors configured to be switched into or out of a circuit of the low noise amplifier; and
a first pair of load resistors coupled to the first differential pair of transistors and a second pair of load resistors coupled to the first differential pair of transistors, wherein the second pair of load resistors are configured to be switched into or out of the circuit of the low noise amplifier.

17. The apparatus of claim 16, further comprising a controller coupled to the low noise amplifier to control at least one component of the low noise amplifier, wherein the controller is integrated on a single substrate with the low noise amplifier.

18. The apparatus of claim 17, further comprising at least one switchable resistor configured to be coupled to the low noise amplifier using the controller, wherein the at least one switchable resistor is integrated on the single substrate.

19. The apparatus of claim 16, wherein the secondary path of the low noise amplifier is to be enabled only if a signal strength of the RF signal is less than a threshold.

20. The apparatus of claim 16, wherein the low noise amplifier has a differential output.

21. The apparatus of claim 16, wherein the first pair of load resistors are coupled between an output of the first differential pair of transistors and a supply voltage node and are to remain as part of the primary path regardless of operating parameters.

22. The apparatus of claim 21, wherein the second pair of load resistors are to be switched into or out of the circuit based on the operating parameters.

23. The apparatus of claim 16, wherein the first differential pair of transistors each has a gate coupled to receive a respective differential portion of the RF signal.

24. The apparatus of claim 16, wherein the apparatus comprises a FM radio tuner formed using a CMOS process.

25. The apparatus of claim 16, wherein the primary path is configured to remain on regardless of operating conditions.

26. The apparatus of claim 16, wherein the controller is to switch the second differential pair of transistors into the circuit of the low noise amplifier while the first differential pair of transistors is to remain on.

* * * * *